(12) United States Patent
Yoneyama

(10) Patent No.: US 6,256,702 B1
(45) Date of Patent: Jul. 3, 2001

(54) NONVOLATILE MEMORY DEVICE WITH EXTENDED STORAGE AND HIGH RELIABILITY THROUGH WRITING THE SAME DATA INTO TWO MEMORY CELLS

(75) Inventor: Akira Yoneyama, Gunma-ken (JP)

(73) Assignee: Sanyo Electric Co., Ltd., Osaka (JP)

( * ) Notice: Subject to any disclaimer, the term of this patent is extended or adjusted under 35 U.S.C. 154(b) by 0 days.

(21) Appl. No.: 09/150,808

(22) Filed: Sep. 10, 1998

(30) Foreign Application Priority Data

Sep. 18, 1997 (JP) .................................................... 9-253594
Sep. 30, 1997 (JP) .................................................... 9-267142

(51) Int. Cl.$^7$ ............................. G06F 12/16; G11C 16/00
(52) U.S. Cl. ..................... 711/103; 365/185.33; 365/200; 365/238.5; 714/6; 714/710
(58) Field of Search .................. 711/103, 5; 365/185.29, 365/185.33, 200, 238.5; 714/718, 710, 711, 6

(56) References Cited

U.S. PATENT DOCUMENTS

| | | | |
|---|---|---|---|
| 4,768,169 | * | 8/1988 | Perlegos ................................ 365/200 |
| 5,367,484 | * | 11/1994 | Alexander et al. ................... 365/200 |
| 5,548,596 | * | 8/1996 | Tobita .................................. 371/21.2 |

\* cited by examiner

*Primary Examiner*—Glenn Gossage
(74) *Attorney, Agent, or Firm*—Hogan & Hartson L.L.P.

(57) ABSTRACT

A nonvolatile memory increases the number of times that data can be written and the length of time that data can be stored through use of architectural and addressing features. A principal feature lies in setting as a high reliability region a specific memory sector (first sector) among a plurality of memory sectors. Within the high reliability sector, two or more memory cells are written with the same data. During reading, the simultaneously written memory cells are read simultaneously, increasing current flow through the parallel current paths. This nonvolatile memory allows the size of the high reliability sector to be adjusted using signals supplied from external to the nonvolatile memory.

12 Claims, 9 Drawing Sheets

*FIG. 1 -- Prior Art*

| MODE | WRITE | ERASE | READ | STANDBY |
|---|---|---|---|---|
| Word Line WLm (Control Gate CG) | 2 V | 14~15 V | 4 V | 0 V |
| Bit Line BLm (Drain D) | 0 V | 0 V | 2 V | 0 V |
| Common Source Line SL (Source S) | 12 V | 0 V | 0 V | 0 V |
| Substrate 102 | 0 V | 0 V | 0 V | 0 V |

FIG. 5

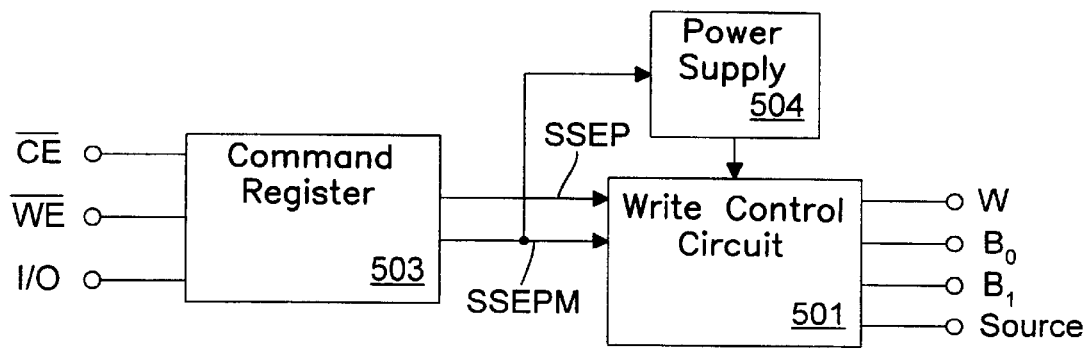
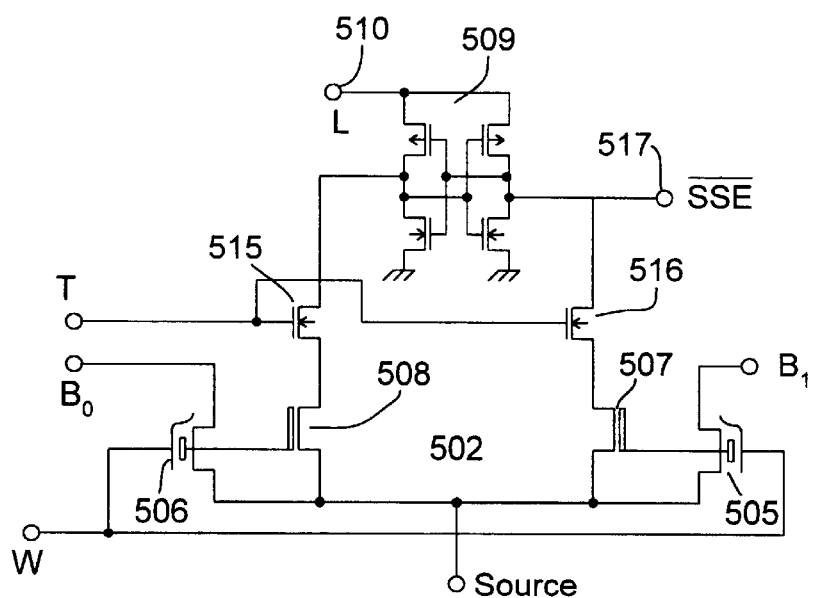
FIG. 9

NONVOLATILE MEMORY DEVICE WITH EXTENDED STORAGE AND HIGH RELIABILITY THROUGH WRITING THE SAME DATA INTO TWO MEMORY CELLS

BACKGROUND OF THE INVENTION

1. Field of the Invention

The present invention relates generally to nonvolatile semiconductor memory devices and, more particularly, to nonvolatile semiconductor memory devices capable of increasing the number of times memory cells can reliably be rewritten and limiting cell current reduction in an extended storage time period memory device.

2. Description of the Related Art

In recent years, nonvolatile semiconductor memory devices have become more important. Nonvolatile memories include ferro-electric random access memories (FRAM), erasable programmable read-only memories (EPROM), electrically erasable programmable read-only memories (EEPROM), and similar devices. EPROMs and EEPROMs store data by accumulating electrical charge carriers on the floating gate of a memory transistor. A control gate within the memory transistor is used to detect a variation in the threshold voltage of the memory due to the presence or absence of programming charge on the gate of the memory transistor. EEPROMs include "Flash" EEPROMs which provide an array of memory cells divided into sub-arrays or "blocks" where data erasure is performed in units of complete blocks.

Flash-EEPROMs include memory cells which may be generally categorized into two types: the split gate type and the stacked gate type. A conventional Flash-EEPROM cell of the split gate type is illustrated in PCT Publication No. WO92/18980. FIG. 1 illustrates, in cross-section, a single memory cell 101 of the split gate type as shown in the Publication. Referring now to FIG. 1, the illustrated p-type single-crystal silicon substrate 102 has n-type source S and drain D regions formed on its surface. The source S and drain D define therebetween a channel region CH, above which a floating gate FG is formed. The floating gate FG is separated from the channel region CH by a first dielectric film 103. A control gate CG is formed extending partially over the floating gate FG with a second dielectric film 104 separating the control gate CG from the floating gate FG. A portion of the control gate CG is disposed over the channel CH and is separated from the channel CH by the first dielectric film 103 so that control gate CG can be used as a select gate 105 for the memory transistor. Data storage is accomplished by accumulating electrons in the floating gate FG using in part a voltage applied to the control gate CG and interacting with the floating gate FG through the second dielectric film 104.

In those memory devices of the type shown in FIG. 1, which may store electrons in the floating gate FG, the cell current that flows through the memory cell decreases as the memory device is subjected to repeated data rewriting cycles. This reduced cell current may result in the memory cell being unable to reliably perform the data write and read operations required by normal operation of the memory cell. Presumably, the reduced cell current is caused by repeated rewrite operations physically damaging or degrading the quality of the second dielectric film 104. In turn, a damaged dielectric film 104 may make it difficult for electrons to "escape" from the floating gate FG and may trap once-escaped electrons within the second dielectric film 104. The trapped electrons may then return to the floating gate FG, whereby the potential applied to the floating gate FG is effectively reduced so that the channel is not well formed beneath the floating gate FG.

Another disadvantage observed when using conventional floating gate memories is that the time period over which data can be reliably stored is limited. In other words, with conventional floating gate memories, there is a risk of data alteration after the lapse of a certain time period, resulting in lack of reliability. Data can be altered as electrons leak through the dielectric film to a floating gate FG that is in the erase state, which results in this gate unintentionally changing to an electron injected state.

SUMMARY OF THE PREFERRED EMBODIMENTS

Preferred embodiments of the present invention avoid the above-identified problems encountered in the use of conventional floating gate memories. A particularly preferred embodiment of the invention sets as a high reliability region a specific memory sector selected from among a plurality of memory sectors. When writing is performed in this high reliability region, two or more memory cells are subjected to writing simultaneously so that the same data signals are stored in each of the two or more memory cells. During reading operations within the high reliability region, the simultaneously written memory cells are all read at the same time. Most preferably, the high reliability memory sector is adjustable in size from components external to the floating gate memory embodying these aspects of the invention.

According to a preferred aspect of the present invention, a nonvolatile semiconductor memory device includes a first and a second memory sector. The first memory sector includes first memory cells, the first memory cells characterized by a first data storage time characteristic and a first data rewrite number characteristic. The second memory sector includes second memory cells, the second memory sector set as a high reliability region so that data stored in the second memory is characterized by a second data storage time characteristic and a second data rewrite number characteristic greater than the first data rewrite characteristic. The size of the second memory sector is externally adjustable.

Another preferred aspect of the present invention provides a nonvolatile semiconductor memory device with at least one first memory sector comprising first memory cells and at least one second memory sector comprising second memory cells; the second memory sector set as a high reliability region. The first memory cells are addressed by a signal including a first address signal generated from at least one address bit, where the first address signal includes an inversion signal and a non-inversion signal complementary to the inversion signal. The second memory cells are addressed by a signal including a second address signal generated from the at least one address bit, the second address signal including an inversion signal and a non-inversion signal identical to the inversion signal. Writing operations to the second memory sector are performed so that at least two of the second memory cells are written simultaneously, and reading operations from the second memory sector are performed so that at least two of the second memory cells are read simultaneously. The number of second memory sectors within the device is externally adjustable.

Another aspect of the invention provides a nonvolatile semiconductor memory device including at least one first memory sector comprising first memory cells and at least one second memory sector comprising second memory cells, where the second memory sector is set as a high reliability region. Writing operations to the second memory sector are performed so that at least two of the second memory cells are written simultaneously and reading operations from the second memory sector are performed so that at least two of the second memory cells are read simultaneously. The device also includes a latch circuit for latching an inversion signal and a non-inversion signal corresponding to one bit of address data and a plurality of selector circuits. The selector circuits are selectively set to supply the inversion signal and the non-inversion signal from the latch circuit to the first and second memory sectors in accordance with an externally supplied control signal. One of the selector circuits provides at least two identical signals to the second sector, thereby simultaneously selecting two or more second memory cells.

Still another aspect of the invention provides a nonvolatile memory having at least one first memory sector comprising first memory cells. The first memory cells are addressed by a signal including a first address signal generated from at least one address bit, the first address signal including an inversion signal and a non-inversion signal complementary to the inversion signal. The memory includes at least one second memory sector set as a high reliability region including second memory cells. The second memory cells are addressed by a signal including a second address signal generated from the at least one address bit, the second address including an inversion signal and a non-inversion signal identical to the inversion signal. Writing operations to the second memory sector are performed so that at least two of the second memory cells are written simultaneously and reading operations from the second memory sector are performed so that at least two of the second memory cells are read simultaneously.

Another aspect of the invention provides a nonvolatile semiconductor memory device including at least one first memory sector comprising first memory cells and at least one second memory sector comprising second memory cells, where the second memory sector is set as a high reliability region. Writing operations to the second memory sector are performed so that at least two of the second memory cells are written simultaneously and reading operations from the second memory sector are performed so that at least two of the second memory cells are read simultaneously. The device also includes a latch circuit for latching an inversion signal and a non-inversion signal corresponding to one bit of address data and a plurality of selector circuits. The selector circuits supply the inversion signal and the non-inversion signal from the latch circuit to the at least one first memory sector. The selector circuits provide at least two identical signals to the at least one second sector, thereby simultaneously selecting two or more second memory cells.

BRIEF DESCRIPTION OF THE DRAWINGS

FIG. 5 shows selected characteristics of some operational modes of memory cells of a nonvolatile semiconductor memory device embodying aspects of the invention.

FIG. 9 shows, in block diagram form, a nonvolatile semiconductor memory device according to another embodiment of the invention.

DETAILED DESCRIPTION OF THE PREFERRED EMBODIMENTS

An explanation of the present invention will be given in terms of various embodiments of a nonvolatile semiconductor memory device implementing one or more aspects of the invention. According to particularly preferred embodiments of the invention, a nonvolatile memory device has one or more sectors reserved as a "special" sector (high reliability region). This high reliability sector is adapted so that when performing writing operations, data are written or "programmed" into two or more memory cells simultaneously; during reading, data are read out of all of the simultaneously written memory cells at the same time. Operation according to this aspect ensures that cell current is substantially doubled in magnitude thus enabling both an increase in the number of times that data can be rewritten and an increase in storage time as compared to that observed for conventional implementations of floating gate memories.

Figure 1:
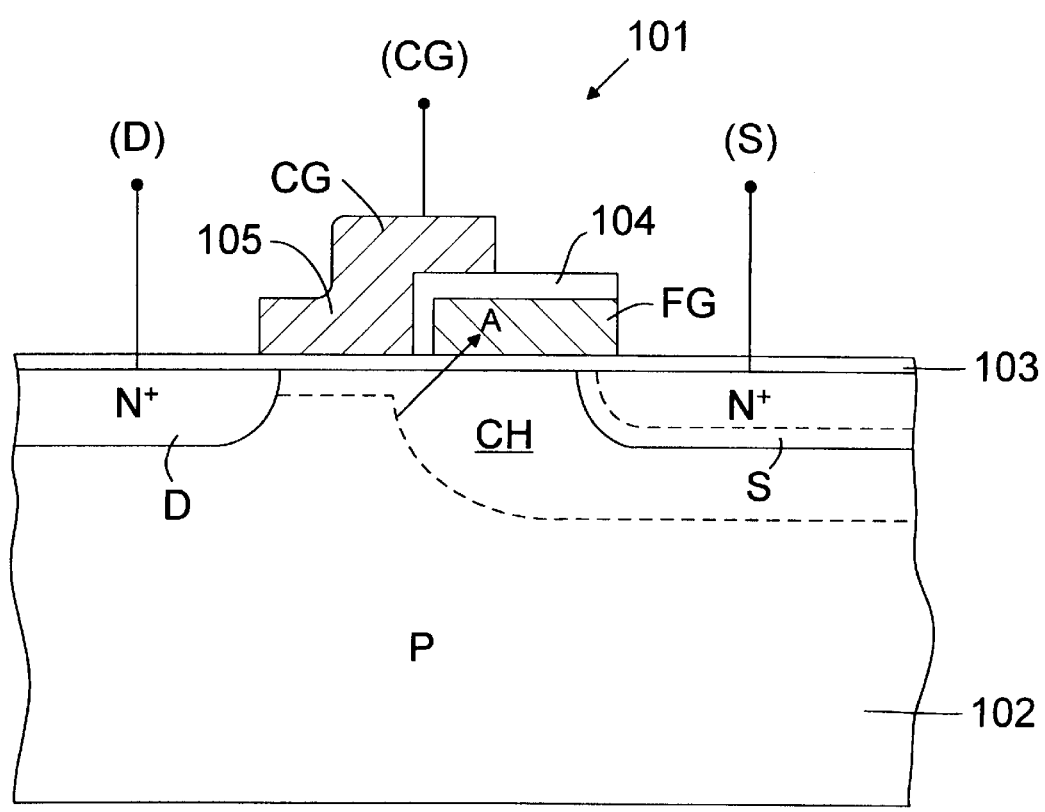
FIG. 1 provides a sectional view of one memory cell of a nonvolatile semiconductor memory device.
Figure 2:
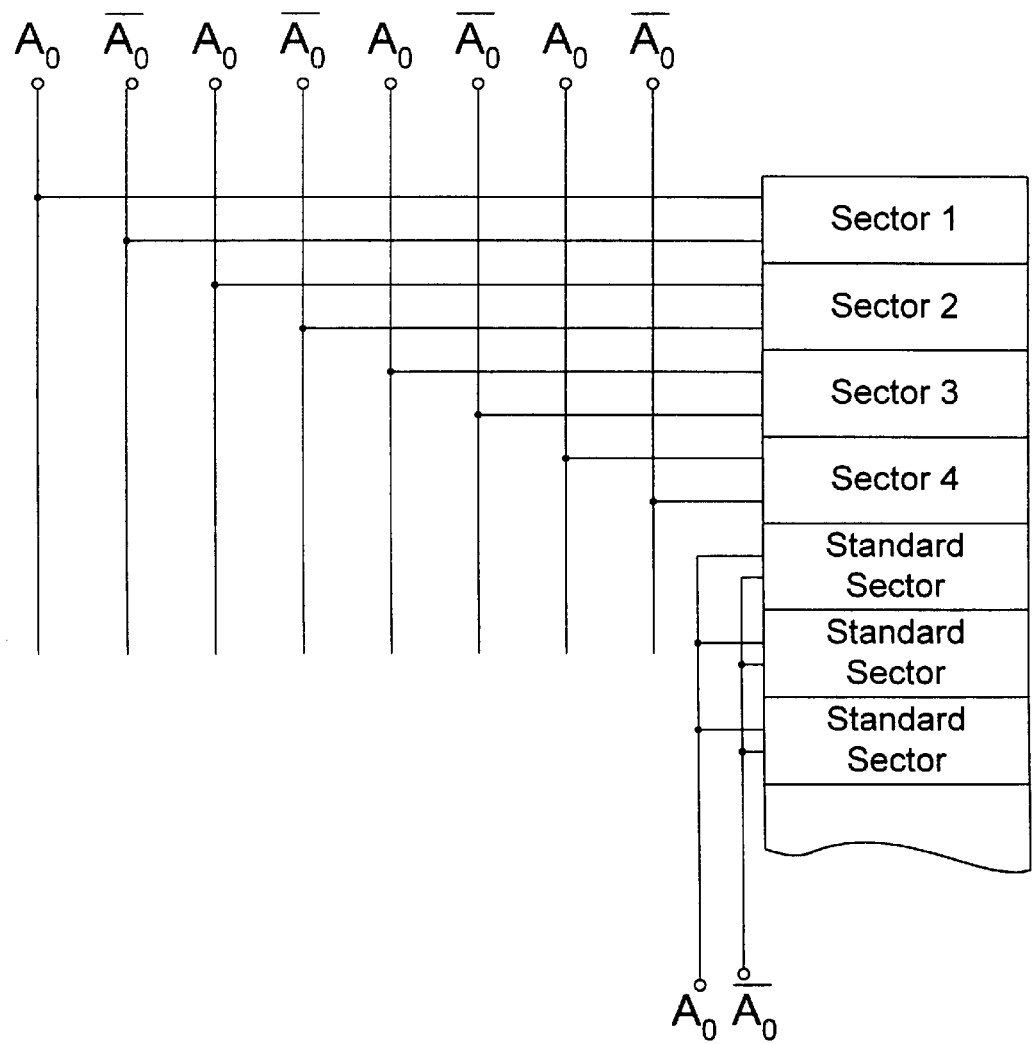
FIG. 2 shows an address map of a memory having a special sector.

FIG. 2 shows the configuration of a part of a nonvolatile semiconductor memory device embodying preferred aspects of the invention. More specifically, FIG. 2 shows an array of memory cells that is organized into both standard and special or high reliability sectors. In the arrangement of FIG. 2, the number of sectors defined as special is variable and selectable from among the four lowest numbered sectors. One embodiment might select the first sector alone as the special sector leaving the remaining ones for use as ordinary or standard sectors. In another embodiment, both the first and second sectors are allocated as special sectors, with the others being left for standard use.

In conventional memory devices, the address signals A0 to A3 are unconditionally supplied in common to the address decoders of all of the sectors, along with the polarity-inverted signals *A0–*A3. By contrast, preferred embodiments of the invention provide an arrangement wherein the address signal A0 and its inversion signal *A0 are independent of each other. In other words, address signal A0 and *A0 do not have the conventional fixed relationship and are independently controllable for the special sectors. As shown in FIG. 2, the remaining standard sectors are provided with the address signal A0 and inversion signal *A0 that have the conventional relationship of a signal and its complement. Accordingly, setup of the special sector or sectors may be selected by designing the address signal A0 and its inversion signal *A0 in a way such that these signals are identical in value for a sector, by way of example.

Figure 3:
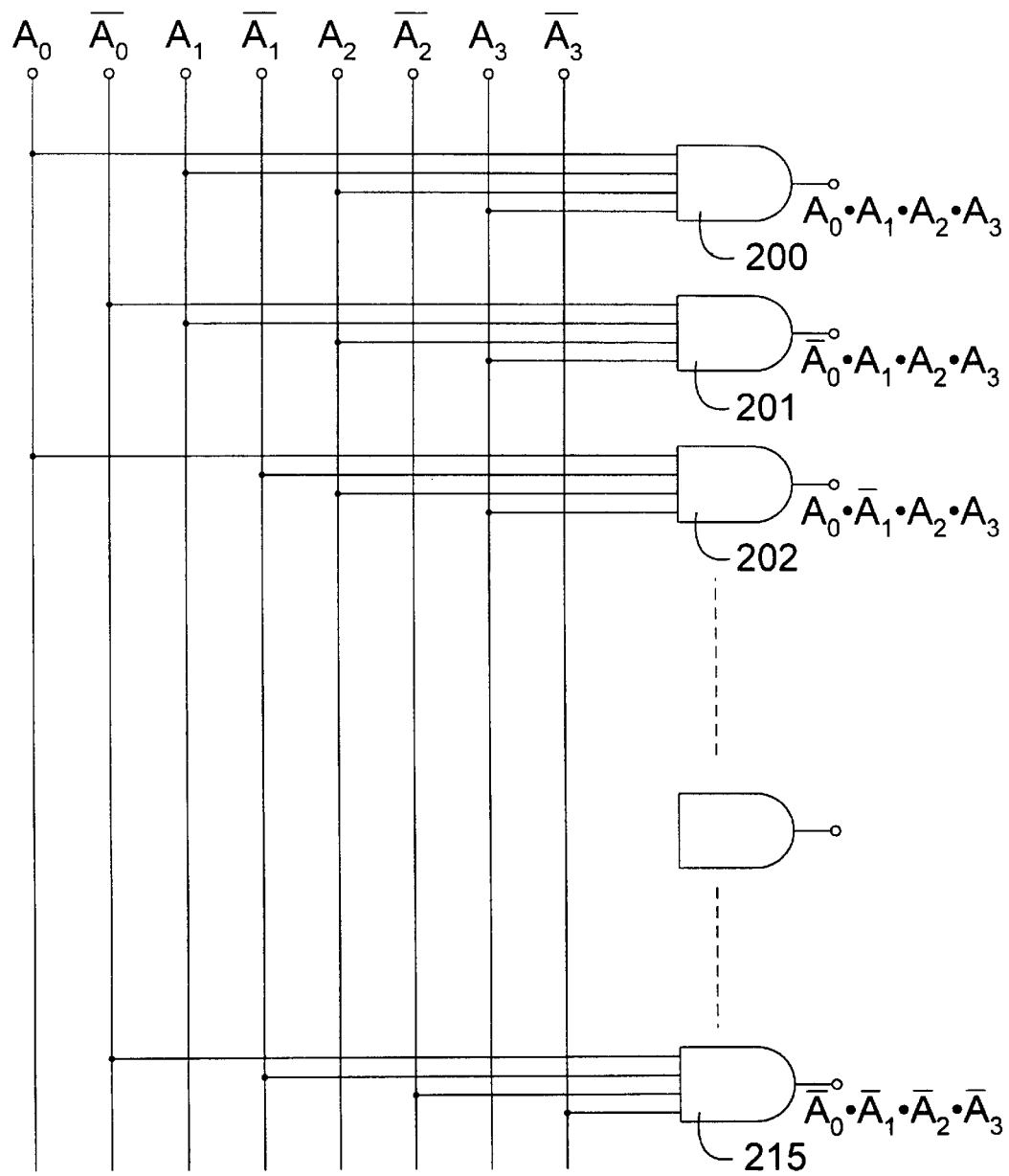
FIG. 3 is a diagram showing one practical circuit configuration of a row decoder 306 of a nonvolatile semiconductor memory device according to an aspect of the invention.

FIG. 3 depicts one exemplary configuration of an address decoder that may be operatively associated with respective sectors in accordance with an embodiment of the invention. In FIG. 3, the decoder can select two memory cells simultaneously as desired to effect the simultaneous reading and writing of memory cells. Four address data bits are supplied to address pins A0–A3, respectively. These address bits are decoded by a parallel combination of sixteen (16) AND gates 200–215. With standard decoders, the output potential of a single AND gate will go high ("H" level) only when a single particular address is provided to the decoder. On the other hand, in the configuration of FIG. 3 the address signals A0 and *A0 (the mark "*" used here would conventionally refer to a polarity inverted data signal) are, for example, constantly kept at the "H" level to ensure that two AND gates are selected upon application of a single address to the decoder. This results in the AND gates 200, 201, for example, being set at the "H" level simultaneously thus selecting two word lines at a time. Simultaneous selection of two word lines allows pairs of memory cells to be written to and read from simultaneously, as is desirable in the practice of preferred aspects of the invention. In essence, the decoder of FIG. 3 allows for address bits to be ignored in effecting a preferred addressing scheme.

Suppose in FIG. 2 that the address bit A0 for the first sector is ignored. In other words, suppose that the bits A0 and *A0 for the first sector are constantly held at "H" irrespective of the value of an input address. Standard input address signals are supplied to the A0 address line and *A0 line coupled to the second to fourth sectors. Then, the first sector alone is reserved as the special sector. Next, suppose only the address bits A0 and *A0 for the second sector are ignored in a similar manner. This configuration sets only the second sector to function as the special sector. In this way, ignoring the address bits A0, *A0 for each sector results in that corresponding sector being reserved as a special sector. This in turn enables the high reliability portion if the nonvolatile memory to be adjusted in size (or storage amount) by external circuitry operatively coupled to the memory device.

Figure 4:
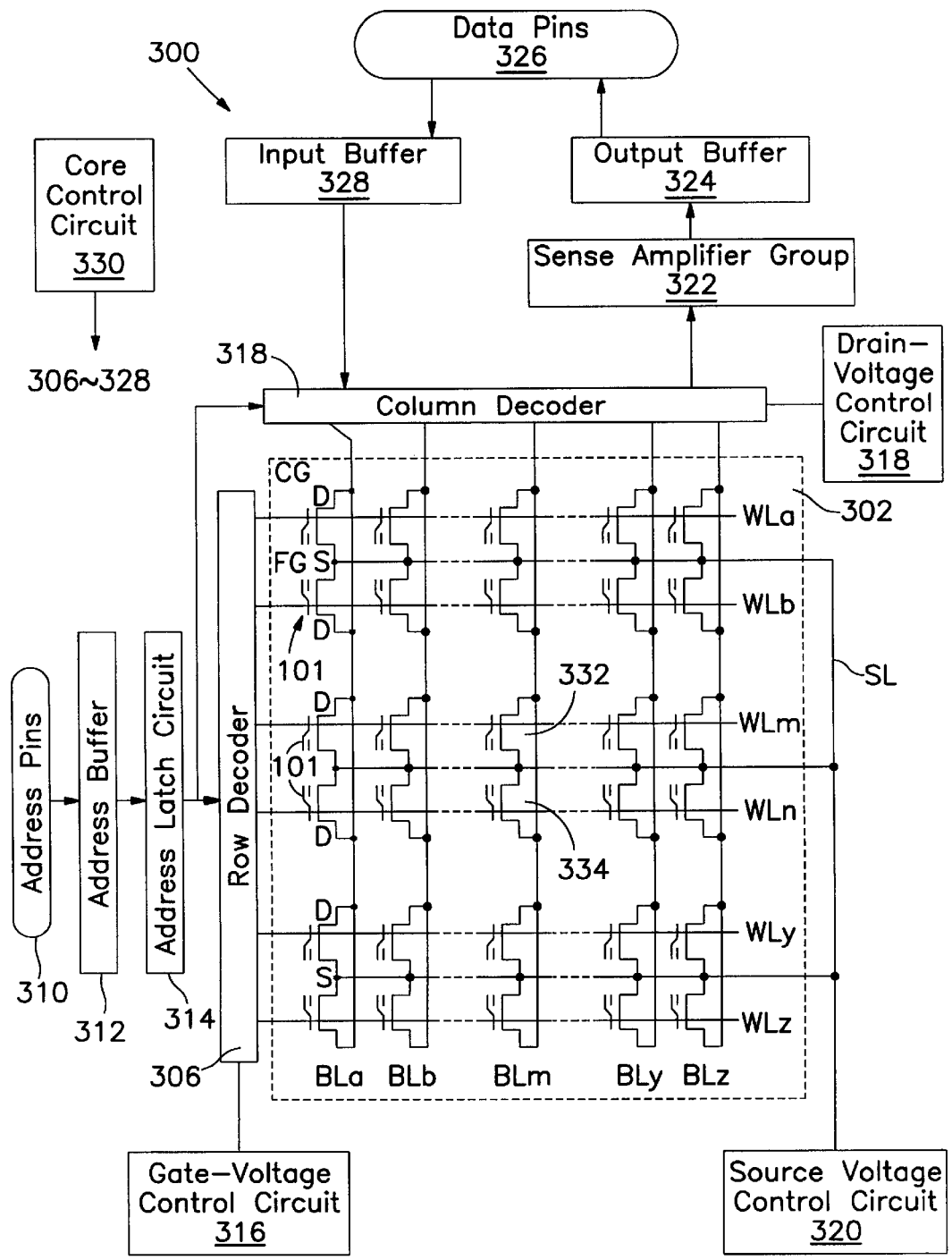
FIG. 4 is a block diagram showing an overall configuration of a nonvolatile semiconductor memory device embodying aspects of the invention.

Turning to FIG. 4, an overall configuration of a Flash EEPROM 300 embodying aspects of the invention is shown which employs memory cells of the split gate type. A memory cell array 302 includes a matrix of rows and columns of memory cells 101. The rows of memory cells 101 are electrically connected at their control gates CG to parallel common word lines WLa to WLz. The columns are coupled at drains D to parallel common bit lines BLa–BLz. All the memory cells 101 have sources S connected together to common source lines SL. Respective word lines WLa–WLz are connected to a row decoder 306 whereas bit lines BLa–BLz are connected to a column decoder 308. Externally supplied row address and column address bits are input to the nonvolatile memory at address pins 310, and then the address bits are transferred from pins 310 through an address buffer 312 to an address latch circuit 314. Of those address bits latched at latch 314, row address bits are sent to the row decoder 306, while column address bits are passed to the column decoder 308.

The memory cell array 302 is divided into a special sector array (for example, those cells associated with word lines WLa–WLn) and a standard sector array (e.g. word lines WLy–WLz). Upon receipt of an address designating a special sector, the row decoder 306 selects two of word lines WLa–WLn (e.g. WLm and WLn) that correspond to the row address as latched in latch 314, then connects the selected word lines WLm, WLn to a gate-voltage control circuit 316.

The column decoder 308 is responsive to receipt of a column address as latched in address latch 314 and selects a corresponding one of the bit lines BLa–BLz (e.g. BLm), which bit line is then coupled to a drain-voltage control circuit 318. The gate voltage control circuit 316 is operable to control voltage potentials of the word lines WLm, WLn as connected via the row decoder 306 in a way that corresponds to a respective one of the operation modes shown in FIG. 5. The output potential of the drain voltage control circuit 318 controls the bit line BLm coupled via the column decoder 308 in a way corresponding to the operation modes illustrated in FIG. 5. The common source line SL is connected to a source voltage control circuit 320. This circuit controls the potential applied to the common source line SL in a way corresponding to the operation modes shown in FIG. 5 to effect data writing operations.

In data reading operations, data are read out of any given one of the memory cells 101 and transferred from a corresponding one of the bit lines BLa–BLz through the column decoder 308 to a sense amplifier group 322. The sense amplifier group 322 includes a predefined number of sense amplifiers (not shown). The column decoder 308 provides an electrical connection between the presently selected bit line BLm and a corresponding sense amplifier. As will be described later, data judged (i.e., detected) by the sense amplifier group 322 is sent from an output buffer 324 via data pins 326 to external circuitry.

In this illustrated embodiment of the invention, two word lines (e.g. WLm and WLn) are simultaneously selected from among those sets of word lines WLa–WLz that select memory cells having sources coupled in common to each other. This selection permits the same data to be written into such two memory cells simultaneously in a relatively simple manner. Accordingly, reading the data from these two memory cells results in a readout cell current being doubled in magnitude. The read, write and other operations of the circuits illustrated in FIG. 4 (306 to 328) are under control of a core control circuit 330.

Externally supplied special sector designation data are input through data pins 326. The designation data are then transferred from the one of the data pins 326 to the column decoder 308 via an input buffer 328. The column decoder 308 operates to control the voltage potentials of the bit lines BLa–BLz selected as stated above in a way dictated by the designation data, as will be described below with reference to FIG. 9.

Consider now a memory cell 332 and memory cell 334 selected as the special-sector memory cells into which the same data signal is to be written in the embodiment illustrated in FIG. 4. The memory cells 332, 334 are related in the manner of memory cells within pages (sectors) having a common source and bit line. A scheme for selecting the word lines WLm, WLn associated with memory cells 332, 334 may be similar to that discussed previously with reference to FIG. 2.

Figure 6:
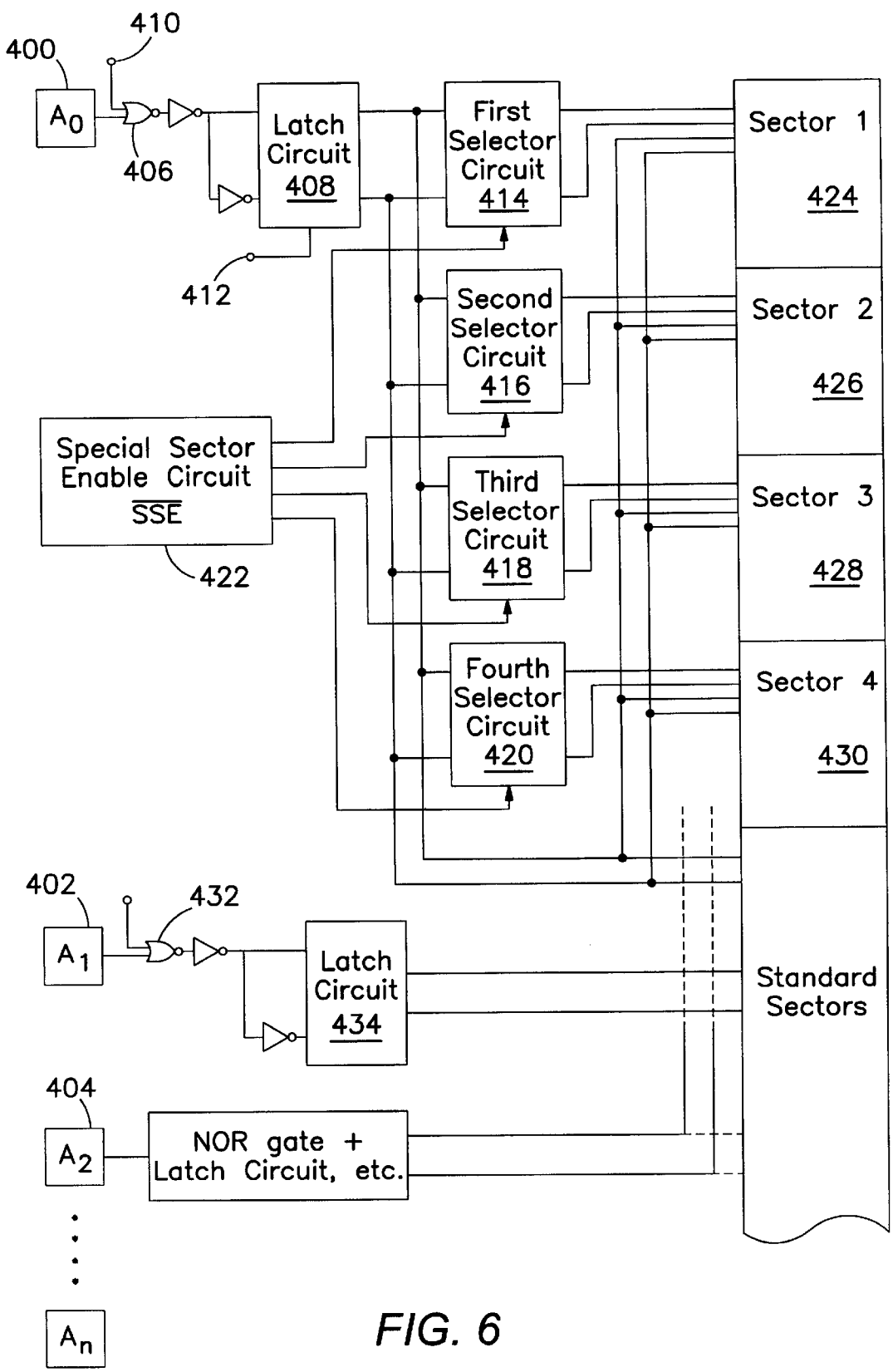
FIG. 6 provides a block diagram showing a nonvolatile semiconductor memory device in accordance with the present invention.

Refer now to FIG. 6, which depicts an exemplary configuration of circuitry including the address buffer 312 and address latch 314 plus row decoder 306 shown in FIG. 4. The circuitry is arranged to ignore an address bit A0 and to simultaneously select two word lines as designated by the bit A0. A bit signal of the address A0 included in the input address is applied to an address pin 400. Bit signals A1, A2 in the input address are passed to address pins 402, 404. The address A0 bit signal is transferred through a chip-enable NOR gate 406 functioning as an address buffer toward a latch circuit 408, which may be a flip-flop circuit acting as an address latch, and is then latched therein. A chip enable signal is supplied to a terminal 410, and a clock signal is supplied to a terminal 412. The latch circuit 408 generates an inversion signal *A0 and a non-inversion signal A0, which are then passed to first to fourth selector circuits 414 to 420. Simultaneously, the signals *A0, A0 are given in common to those address decoders that are not selectable as the special sectors.

The first to fourth selector circuits 414–420 are responsive to receipt of control signals from a special sector enable (SSE) circuit 422, which selects whether to pass the inversion and non-inversion signals *A0, A0 through or to force the two signals to be at the same "H" level in potential. For example, when control signals of a pattern "L, H, H, H" are given from the SSE circuit 422 to the first to fourth selectors 414–420, the first selector 414 generates a pattern "H, H" whereas the second to third selectors 416–420 let the input inversion signal *A0 and non-inversion signal A0 pass through. In this way, the inversion and non-inversion signals *A0, A0 of "H" level are supplied to the decoder of a first sector 424, while the signals A0, *A0 are supplied from the second to fourth selectors 416–420 to the second to fourth sectors 426–430.

When this is done, an address A1 bit signal is supplied from the address pin 402 through a NOR gate 432 and latch circuit 434 to the first to fourth sectors 424–430 and also to all remaining sectors' decoders. A similar operation is performed for an address A2 bit signal supplied from address pin 404. This results in the first sector 424 alone receiving the signal with the A0 bit ignored, causing sector 424 to select two word lines at a time. It is noted that in the nonvolatile semiconductor memory of FIG. 6, while the address input A0 is ignored upon selecting a special sector, externally supplied address data is passed to A1–An; when accessing standard sectors, data is passed to A0–An.

Figure 7:
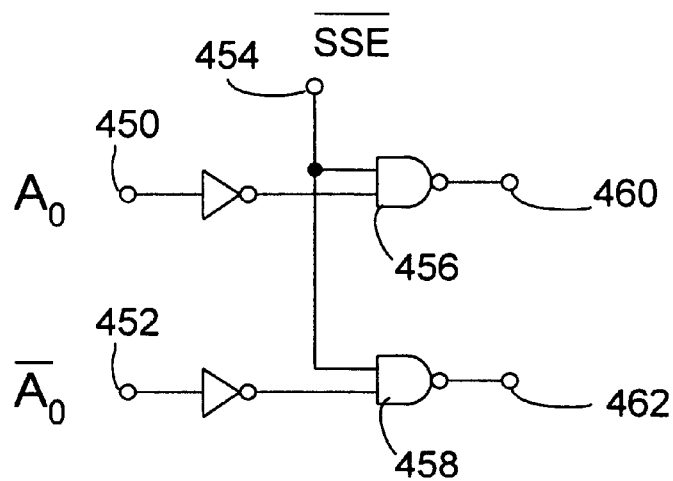
FIG. 7 is a circuit diagram showing in greater detail exemplary circuitry for the first to fourth selector circuits shown in FIG. 6.

To increase the extent of the high reliability region, e.g., by increasing the number of special sectors, the A0-bit ignored signal may be supplied to the second sector 426 in addition to the first sector 424. The SSE circuit 422 accomplishes this by supplying control signals in a pattern "L L H H" to the first to fourth selectors 414–420. With the block shown in FIG. 6, selective use of the special sectors is achievable by permitting users to switch the control signal of SSE circuit 422 through external application of designation signals. An exemplary configuration of each of the first to fourth selectors 414–420 is shown in FIG. 7. The inversion signal *A0 and non-inversion signal A0 are supplied to terminals 450, 452 from the latch circuit 408. A control signal is fed to a terminal 454 from the SSE circuit 422. Upon receipt of "L" level signal at control terminal 454, output terminals 460, 462 of NAND gates 456, 458 are forced to be at "H" level. When receiving "H" at terminal 454, the inversion signal *A0 and non-inversion signal A0 appear directly at output terminals 460, 462.

An explanation is now given of respective operation modes (erase, write, and read modes) of the Flash EEPROM 300 in conjunction with FIGS. 1 through 7.

(a) Erase Mode

When the EEPROM is set in the erase mode, the potentials of all the bit lines BLa–BLz and common source line SL are held at ground level (=0 V). A selected word line WLm is supplied with a voltage of 14 to 15 volts, whereas the remaining (non-selected) word lines WLa–WL1, WLn–WLz are kept at ground potential. With the application of these voltages, the potential on the control gate of a respective one of those memory cells 101 connected to the selected word line WLm is raised to 14 to 15 V. The electrostatic capacitance between the floating gate FG and portions of the memory cell including the source S and substrate 102 is almost always greater than the gate-to-gate electrostatic capacitance between the control gate CG and floating gate FG. Due to this, a high electric field is created between the control gate CG and floating gate FG when the control gate CG is at 14–15 V and the source is at 0 V. This results in a Fowler-Nordheim (FN) tunnel current flowing as electrons on the floating gate FG move toward control gate CG, erasing the data signal stored in memory cell 101.

The erase operation is done at the same time for all of the memory cells 101 coupled to the selected word line WLm. As necessary, the erase operation may be carried out for all of the memory cells 101 associated with multiple ones of the word lines WLa–WLz by simultaneous selection of these word lines. This erase scheme is called the "block" erase, reflecting the fact that the memory cell array 302 is divided into several blocks each coupled to and addressed by plural ones of the word lines WLa–WLz, permitting data erasure to be done in units of blocks.

(b) Write Mode

In the data write mode, the bit lines BLa–BLz are controlled so that bit lines associated with certain memory cells of interest-i.e., the memory cells to be programmed by injecting of electrons into their floating gates FG-are kept at ground potential whereas a high voltage is supplied to the remaining bit lines coupled to the other cells. Note that in preferred embodiments of the instant invention, individual data signals (such as bits) of important data are "duplicatively" stored in both the memory cell 332 and cell 334 at the same time. Such a duplicative storage strategy offers more stable data storage as well as allowing an increase in the rewrite number for the memory. To effect duplicative storage, the illustrative embodiment applies a voltage of 2 volts to the word lines WLm and WLn and sets the remaining non-selected word lines WLa–WL1, WLo–WLz at ground potential. The common source line SL is given a 12-V voltage. Writing may then be done with respect to the memory cells 332, 334 simultaneously.

Each memory cell 101 includes a transistor having its source S and drain D, and control gate CG, where the transistor has a threshold voltage Vth that is typically about 0.5 volts. Within individual ones of selected memory cells 101, electrons residing within the drain D move or "migrate" into the channel CH, which is in the inverted state. This inverted channel results in a current (cell current) flowing from source S to drain D. On the other hand, upon application of a 12 V voltage to source S, the potential underlying floating gate FG is raised due to the capacitive coupling between source S and floating gate FG. This creates a high electric field between control gate CG and floating gate FG. Thus, electrons within channel CH are electrically accelerated producing the so-called "hot" electrons, which are then injected into the floating gate FG as shown by arrow A in FIG. 1. As a result, a desired amount of charge is accumulated on floating gate FG of each selected memory cell 101 so that 1-bit data are written and stored in the cells.

(c) Read Mode

When the Flash EEPROM is in the read mode, a voltage of 4 volts is applied to the word lines WLm, WLn and from the word lines to the control gates CG of the selected memory cells 101, while any remaining, non-selected word lines WLa–WL1, WLo–WLz are set at ground potential. A voltage of 2 V is applied to the one bit line BLm connected to the drains D of selected memory cells 332, 334, whereas the other non-selected bit lines BLa–BL1, BLn–BLz are coupled to ground.

As discussed previously, the floating gate FG of each of the erased ones of the memory cells 101 is charged to a positive polarity as the result of removing electrons from the floating gate FG. The floating gate FG of each one of the programmed memory cells 101 is, on the other hand, charged to a negative polarity by injecting electrons into the floating gate. Accordingly, in the individual erased memory cell 101, the channel CH immediately underlying the floating gate FG is rendered conductive (turned on) while the channel CH of each programmed cell is rendered nonconductive (turned off). Consequently, application of a read voltage of 4 volts to the control gate CG causes a cell current to flow from drain D to source S in the erased cell that is greater in magnitude than the current that flows in a programmed memory cell upon application of a similar read voltage.

Referring once again to FIG. 4, then, memory cells 332, 334 are programmed so that the floating gate has a negative polarity. This programmed state is identified in the read operation by a relatively low level of current flow. More specifically, when the read voltage is applied to the gates of memory cells 332, 334, a cell current flows in the memory cells 332, 334 that is sufficiently small so that the cells are recognized as being programmed by the normal read circuits of the memory. On the other hand, assuming that these cells 332, 334 are not subject to programming (i.e., the cells are kept in the erased state) and their floating gates FG are charged to the positive polarity, an increased amount of current flows through the memory cells. This "erased" read current may be two times greater than the read current detected for a standard cell.

The resulting read data is forwarded to a corresponding sense amplifier of the sense amplifier group 322, which attempts to identify the logic value of the data, "1" or "0", by determining whether the value of a cell current, Id, detected from a cell 101 is greater or less than a reference value. The judgment output from the comparison to the reference current effects the reading of cell data from each of the memory cells 101. Those skilled in the art will appreciate that the data readout is typically done using the definition that data from erased memory cells has the logical value of "1" whereas data from programmed cells is "0". In the illustrated embodiment of the invention, the individual memory cells 101 are capable of storing therein binary data of either the logic value "1" as designated by the erase state or "0" as designated by the programmed state.

Figure 8:
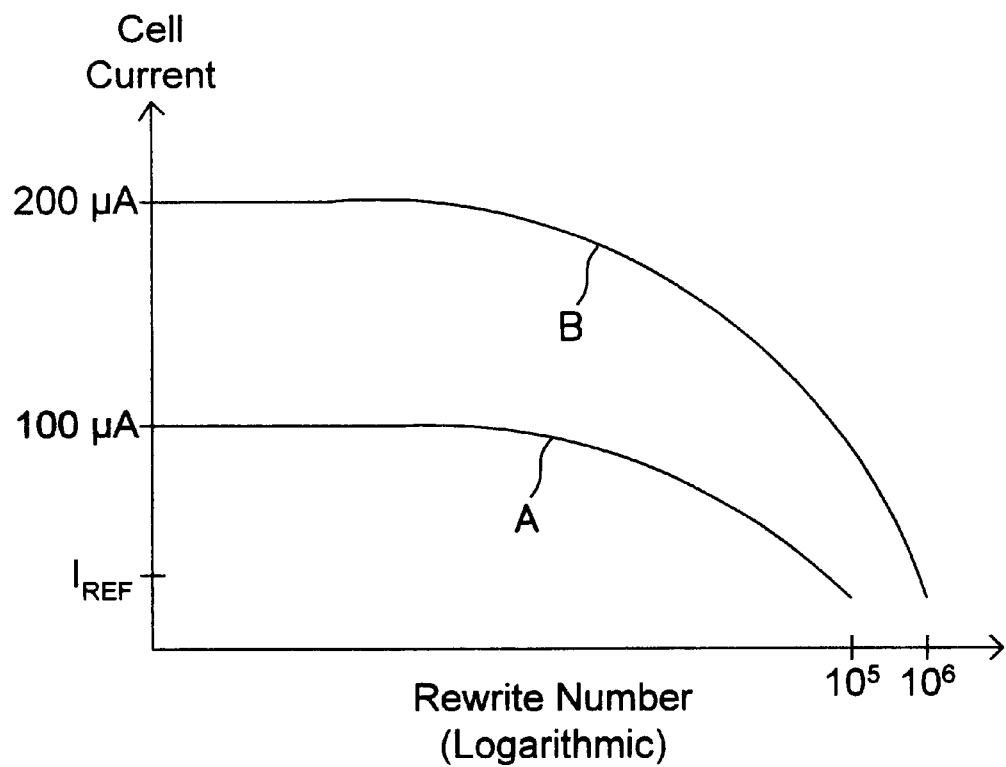
FIG. 8 is a graph showing a relation of a rewrite number versus cell current of the nonvolatile semiconductor memory device.

FIG. 8 shows a relation of a rewrite number versus a cell current. The rewrite number represents how many times the date rewrite or re-programming is carried out and is plotted logarithmically along the horizontal axis of the graph of FIG. 8. A curve "A" indicates a cell current resulting from standard "one-at-a-time" read operations wherein a single memory cell is selected for read at a time. Curve "B" demonstrates a cell current resulting from a "two-at-a-time" read procedure in accordance with certain preferred embodiments of the invention, wherein two memory cells are read simultaneously. "Iref" in FIG. 8 represents the value of a reference current used in determining whether a stored data bit is a logic "0" or "1". Comparing the cellcurrent curves A and B with the reference value Iref, FIG. 8 shows that a Flash EEPROM according to an embodiment of the invention, identified by curve B in FIG. 8, can be rewritten approximately ten times more than the standard EEPROM identified by curve A. The curves of FIG. 8 demonstrate that the floating gate memory cell rewrite number may be significantly increased through practice of preferred embodiments of the invention.

It should be noted that the invention is also capable of increasing the amount of time that data are stored through the accumulation and long-term storage of electrons on the floating gate of each memory cell. The write operation places the floating gate of the written memory cell in the "deep" positive polarity state due to removal of electrons therefrom. If the floating gate is in such a highly positive state, the gate may accommodate an increased number of electrons leaking from nearby structures onto the gate without threatening the integrity of the data stored in the memory cell. The gradual reduction in programming charge can continue for a longer period of time without affecting operation of the memory cell due to the positive state achieved in accordance with preferred embodiments of the invention. The potential drop associated with charge leaking onto the floating gate could otherwise make forming the underlying channel region more difficult, which reduces the current that flows in the memory cell. Advantageously, by practice of preferred embodiments of the invention, the cell current reduction is suppressed by one half, thus increasing the time period over which data can reliably stored.

Turning now to FIG. 9, circuitry for use in EEPROMs according to some preferred embodiments of the invention is shown that permits end users to establish a desired number of special sectors by external control of the EEPROM using software-based programming schemes. The circuitry of FIG. 9 generally corresponds to the block 312 shown in FIG. 4. Most preferably, the EEPROM is set up in a way such that, once the special sectors are set up, the memory device is capable upon powerup of "automatic" selection of such special sectors. The original designation of one or more special sectors is performed by use of a special sector designation command signal (or data) externally supplied to an appropriate one of a set of input/output (I/O) terminals of the EEPROM, for example, to an I/O terminal attached to the data pins 326 shown in FIG. 4. Receipt of such a designation command renders operative a write control circuit 501 causing an SSE signal generator circuit 502 to store certain data specifying which one or ones of the memory sectors are reserved as the special sectors. Then, SSE signal generator 502 generates and issues an SSE signal of the "L" level.

After SSE signal generator 502 stores the special sector command, the desired SSE signal is automatically generated with little time-lag upon powerup of the memory device. Most desirably, this SSE signal is generated prior to actually activating the memory cells of the special sectors in a power on or power-up sequence for the memory device. This activation timing enables designation of special sectors to be completed before the special sector memory cells are rendered operative.

Figure 10:
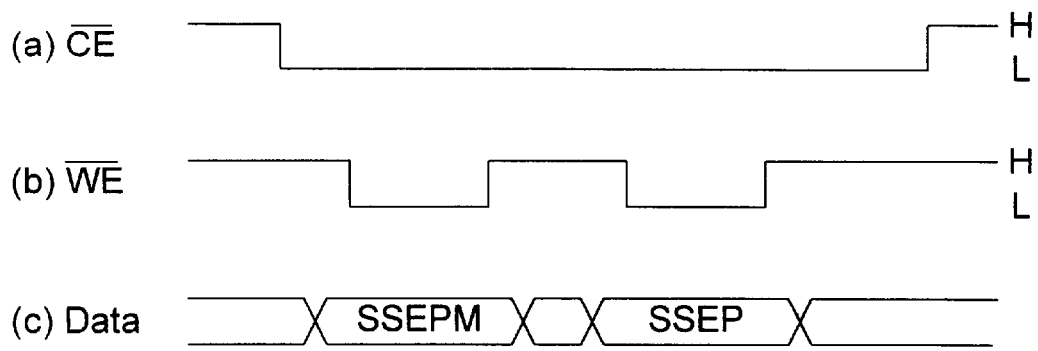
FIG. 10 is a representation of signal waveforms illustrating some operations of the device of FIG. 9.

As shown in FIG. 9, a command register 503 receives the externally supplied designation command and stores therein the special sector designation command. Some signals available during the operation are shown in the timing diagrams of FIGS. 10A–10C. The register 503 receives a chip enable signal *CE and write enable signal *WE. When these signals (*CE, *WE) are at the "L" level, the command (data) arriving at the I/O terminal is stored in register 503. A special-sector enable program mode (SSEPM) setup command is provided first to the command register 503 to establish an operation mode for enabling designation of the special sector or sectors. The next command provided is a special-sector enable program (SSEP) command, which contains information as to which sector is to be reserved as the special-sector. The SSEPM command renders operative the write control circuit 501 along with a power supply 504 that provides a raised potential or "boosted" power supply voltage. After lapse of a predefined time, the SSEP command is supplied to write control circuit 501, which performs a programming operation with respect to a designated one of multiple SSE signal generator circuits.

In the designated SSE signal generator, an appropriate number of sectors are present, equal in number to the number of special sectors required. The SSE signal generator 502 depicted in FIG. 9 is one such SSE signal generator. The illustrative SSE generator 502 includes a number of built-in nonvolatile memory cell transistors, which may be floating gate metal oxide semiconductor (FATMOS) transistors. To software-program these transistors, the write control circuit 501 generates and issues appropriate voltages which are then applied to the word lines and bit lines as well as to the common source line.

Here, assume that an externally supplied special sector designation command is stored in the SSE signal generator 502 of FIG. 9. These nonvolatile memory cell transistors 505, 506 of SSE generator 502 are initially set in the erase state, for example, using the voltage setup scheme discussed above with reference to FIG. 5. Another nonvolatile memory transistor 507 has its source line and floating gate FG coupled in common together so that transistor 507 is erased when the transistor 505 is erased. The same is true for a nonvolatile memory transistor 508 due to its relationship transistor 506: when transistor 506 is erased, transistor 508 is also erased since it has its source line commonly coupled to its floating gate FG. This also results in the nonvolatile memory transistors 507, 508 being erased simultaneously. Under this condition the nonvolatile memory transistor 506 is programmed (by injection of electrons into its floating gate FG) while transistor 505 is kept non-programmed. Consequently, transistor 508 is turned off while transistor 507 is turned on. The information corresponding to this turn-on state is stored in a latch circuit 509 for later use as an *SSE signal.

Figure 11:
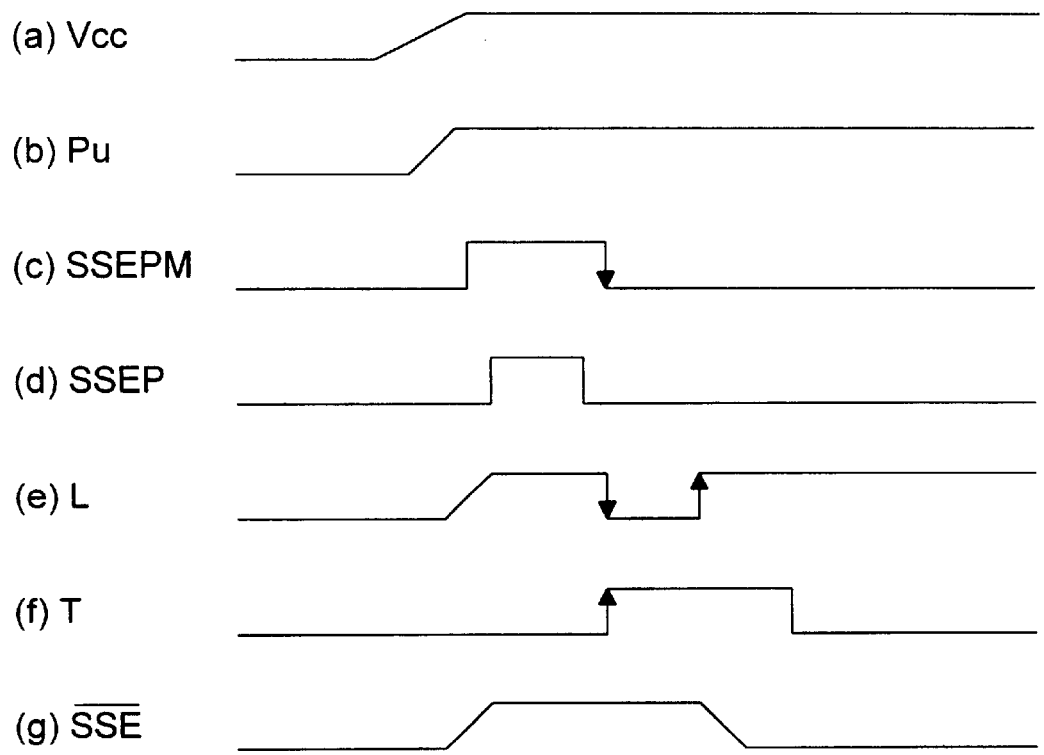
FIG. 11 presents signal waveforms illustrating some operations of the device of FIG. 9.

A preferred storage timing scheme of this latch circuit 509 will be explained with reference to FIGS. 11A–11G. Upon receipt of a command, the SSEPM voltage rises up as shown in FIG. 11C; subsequently, the SSEP signal rises in potential. This permits a power supply terminal 510 of the latch 509 to receive a power supply voltage L with its waveform depicted in FIG. 11E. This voltage L ramps upward in response to power-up, and ramps down when SSEPM drops in potential. Latch 509 is temporarily rendered inoperative upon the fall of SSEPM as the power supply voltage L is pulled low, reducing the power supply level to both sides of the latch 509. The circuitry of FIG. 9 also includes a pair of signal transmission transistors 515; 516 each having a timing signal T supplied to its gate electrode as shown in FIG. 11F. Upon receiving timing signal T, transistors 515, 516 are rendered conductive (turned on). Signal T shown in FIG. 11F rises up in potential in synchronization with the falling potential of the SSEPM signal of FIG. 11C. This causes latch 509 to be powered up after signal application.

When the signal SSEPM rises in potential, the transistor 507 is turned on causing a current to flow in the latch circuit 509 and in transistors 516, 507. An output node 517 of latch 509 is at the "L" level. Thus, a control signal is obtained as the *SSE signal for use in selecting two word lines simultaneously. When this is done, the other SSE signal generators (not shown) are such that each latch circuit is inverted providing a signal of "H" level as the *SSE signal.

An explanation will next be given of the case where a region of more than one special sector has been defined, the EEPROM is powered down after completion of software-programming of the SSE signal generator(s), and thereafter the memory device is again powered up for use.

When the potential of a power supply voltage Vcc rises as shown in FIG. 11A, the potential of a power-up signal Pu likewise increases in potential as shown in FIG. 11B. Data carriers are left on the floating gates FG of transistors 507, 508 so that upon application of an appropriate bias voltage, transistor 507 rapidly turns on and transistor 508 turns off. This ensures that data is stored in latch 509 in response to activation of the power supply. This operation executes sufficiently rapidly as compared to the switching speeds of those memory cells which require read operations, which in turn makes it possible to perform the intended read/write operations for the special sectors designated, without any specific difficulties.

According to the present invention, a nonvolatile semiconductor memory device is obtainable which does not exhibit as significant 9 reduction in cell current even after many rewrite cycles. According to this invention, since two or more memory cells may be designed so that the same data are written into and read from the same two or more memory cells, it becomes possible to increase the rewrite number while enabling important data to be stored therein for an extended time period. Furthermore, according to the invention, the dimension or size (extent) of a memory sector used as a high reliability region can be externally adjusted.

While the present invention has been described with particular emphasis on certain preferred embodiments thereof, the invention is not limited to these particular embodiments. Those of ordinary skill will appreciate that different implementations of this invention and alternate variations can be made, consistent with the teachings herein. Accordingly, the scope of the invention is to be determined by the claims that follow.

What is claimed:

1. A nonvolatile semiconductor memory device, comprising:

a first memory sector comprising first memory cells, the first memory cells characterized by a first data storage time characteristic and a first data rewrite number characteristic; and a second memory sector comprising second memory cells, the second memory sector set as a high reliability region so that data stored in the second memory sector is characterized by a second data storage time characteristic greater than the first data storage time characteristic and a second data rewrite number characteristic greater than the first data rewrite characteristic, whereby the number of second memory cells within the second memory sector is externally adjustable.

2. The device of claim 1, wherein data in the second memory sector are stored by addressing at least two memory cells simultaneously.

3. The device of claim 1, wherein data in the second memory sector are read by addressing two memory cells simultaneously.

4. The device of claim 1, wherein adjustment of the size of the second memory sector is accomplished responsive to a command.

5. The device of claim 1, wherein the first memory sector is selected by a first address of a first length and the second memory sector is selected by a second address of the first length, wherein at least one bit within the second address is ignored.

6. A nonvolatile semiconductor memory device, comprising:

a first memory sector comprising first memory cells; and a second memory sector comprising second memory cells, the second memory sector set as a high reliability region, wherein writing operations to the second memory sector are performed so that at least two of the second memory cells are written simultaneously, and wherein reading operations from the second memory sector are performed so that at least two of the second memory cells are read simultaneously, whereby the number of second memory cells within the second memory sector is externally adjustable.

7. The device of claim 6, wherein the first memory cells are addressed individually during writing operations and reading operations.

8. The device of claim 6, wherein data in the second memory sector are read by addressing at least two second memory cells simultaneously.

9. A nonvolatile semiconductor memory device, comprising:

at least one first memory sector comprising first memory cells, the first memory cells addressed by a signal including a first address signal generated from at least one address bit, the first address signal including an inversion signal and a non-inversion signal complementary to the inversion signal; and at least one second memory sector comprising second memory cells, said at least one second memory sector set as a high reliability region, the second memory cells addressed by a signal including a second address signal generated from the at least one address bit, the second address signal including an inversion signal and a non-inversion signal identical to the inversion signal, wherein writing operations to said at least one second memory sector are performed so that at least two of the second memory cells are written simultaneously, and wherein reading operations from said at least one second memory sector are performed so that at least two of the second memory cells are read simultaneously, whereby a number of second memory sectors within the device is externally adjustable.

10. The device of claim 9, wherein said first memory sectors are selected by first addresses of a first length and said second memory sectors are selected by second addresses of the first length, wherein at least one bit within a second address is ignored.

11. The device of claim 9, wherein the first memory cells are addressed individually during writing operations and reading operations.

12. The device of claim 9, wherein data in the second memory sector are read by addressing at least two second memory cells simultaneously.

* * * * *